United States Patent [19]

Jean et al.

[11] Patent Number: 5,270,268

[45] Date of Patent: Dec. 14, 1993

[54] ALUMINUM BORATE DEVITRIFICATION INHIBITOR IN LOW DIELECTRIC BOROSILICATE GLASS

[75] Inventors: Jau-Ho Jean, Export; Tapan K. Gupta, Monroeville, both of Pa.

[73] Assignee: Aluminum Company of America, Pittsburgh, Pa.

[21] Appl. No.: 949,154

[22] Filed: Sep. 23, 1992

[51] Int. Cl.$^5$ .......................... C03C 1/00; C03C 14/00
[52] U.S. Cl. ......................................... 501/32; 501/17; 501/21; 501/66; 501/70; 501/127; 501/153; 428/426; 428/427; 428/688
[58] Field of Search ................. 501/17, 32, 21, 66, 501/70, 127, 153; 264/65, 56, 60, 61; 428/426, 427, 688, 901

[56] References Cited

U.S. PATENT DOCUMENTS

| | | | |
|---|---|---|---|
| 3,795,524 | 3/1974 | Sowman | 501/95 |
| 3,926,648 | 12/1975 | Miller | 106/39.6 |
| 4,539,300 | 9/1985 | Coblenz | 501/98 |
| 4,654,095 | 3/1987 | Steinberg | 156/89 |
| 4,655,864 | 4/1987 | Rellick | 156/89 |
| 4,672,152 | 6/1987 | Shinohara et al. | 174/68.5 |
| 4,706,163 | 11/1987 | Maher | 361/321 |
| 4,707,399 | 11/1987 | Rambosek | 428/225 |
| 4,755,490 | 7/1988 | DiLazzaro | 501/17 |
| 4,774,210 | 9/1988 | Ray | 501/127 |
| 4,788,046 | 11/1988 | Barringer et al. | 423/122 |
| 4,804,642 | 2/1989 | Ray | 501/87 |
| 4,804,646 | 2/1989 | Ray | 501/105 |
| 4,824,623 | 4/1989 | Rambosek | 264/60 |
| 4,849,379 | 7/1989 | McCormick | 501/20 |
| 4,849,380 | 7/1989 | Sawhill | 501/20 |
| 4,879,261 | 11/1989 | Burn | 501/32 |
| 4,970,577 | 11/1990 | Ogihara et al. | 357/74 |
| 5,024,975 | 6/1991 | Hartmann | 501/65 |
| 5,063,566 | 11/1991 | Dixon | 372/22 |
| 5,071,793 | 12/1991 | Jean et al. | 501/16 |
| 5,079,194 | 1/1992 | Jean et al. | 501/17 |
| 5,141,899 | 8/1992 | Jean et al. | 501/18 |

Primary Examiner—Mark L. Bell
Assistant Examiner—Michael A. Marcheschi
Attorney, Agent, or Firm—David W. Pearce-Smith

[57] ABSTRACT

A ceramic composition for forming a ceramic dielectric body having a dielectric constant of less than about 5.5 and a TCE of less than about 3.5 ppm/°C. The composition comprises a mixture of finely divided particles of 20–80 vol. % borosilicate glass and 20–80 vol. % of $Al_xB_yO_z$ wherein x is in the range of 4 to 22, y is in the range of 2 to 5, and z is in the range of 9 to 36. The $Al_xB_yO_z$ inhibits the formation of crystalline forms of silica. The composition can be used with a polymeric binder to produce an unfired green tape which is co-fireable with high conductivity metallurgies such as gold, silver and silver/palladium.

7 Claims, No Drawings

ALUMINUM BORATE DEVITRIFICATION INHIBITOR IN LOW DIELECTRIC BOROSILICATE GLASS

FIELD OF THE INVENTION

The invention relates to dielectric compositions. More particularly the invention relates to glass and ceramic materials that are sintered at low temperatures to produce ceramic bodies having low coefficients of thermal expansion and a dielectric constant below 5.5.

BACKGROUND OF THE INVENTION

Conventionally, alumina ($Al_2O_3$) is used as a dielectric material for microelectronic packages. It has excellent electrical (insulating), thermal and mechanical (especially strength) properties. Alumina based packages, generally containing 4–10 wt. % glass, require sintering temperatures above 1500° C. which necessitates the use of refractory metals such as molybdenum or tungsten for the electrical interconnections so that the metal can be co-fired with the package. These metals have poor electrical conductivity as compared to highly conductive metals such as copper, and secondly, they require the use of strongly reducing atmospheres during co-firing necessitating expensive furnace systems.

The development of multilayer ceramic circuit boards is toward higher frequency, higher density and higher speed devices. $Al_2O_3$ has a relatively high dielectric constant of about 9.9, causing high signal propagation delay and low signal-to-noise ratio (crosstalk). The signal propagation delay (t) in ceramic substrates is affected by the effective dielectric constant of the substrate (k') in the following equation:

$$t = (k')^{0.5}/C$$

where C is the speed of light. It can be found that the signal propagation delay can be dramatically reduced by a reduction in the effective dielectric constant of the substrate. For example, if the dielectric constant of a material is reduced from 10 (approximately the k' of $Al_2O_3$) to 5, the signal propagation delay can be reduced by 30%. A small signal delay is especially important for the substrate housing a chip with a very dense integrated circuit, for instance, very large scale integrated circuit (VLSI).

Furthermore, alumina has a coefficient of thermal expansion of about $7.4 \times 10^{-6}/°C$. (in the 20°–200° C. range) as compared with $3.4 \times 10^{-6}/°C$. for silicon. This mismatch in thermal expansion results in design constraints and reliability concerns when attaching a silicon wafer to the substrate.

Heretofore, most of the dielectric materials used in multilayer circuits have been conventional thick film compositions. A typical circuit is constructed by sequentially printing, drying and firing functional thick film layers atop a ceramic substrate which is usually 92–96 wt. % $Al_2O_3$. The multiple steps required make this technology process intensive with the large number of process steps and yield losses contributing to high costs. Thick film technology nevertheless fills an important need in microelectronics and will continue to do so in the foreseeable future.

Recently, dielectric thick film compositions with low dielectric constants of 5 have been introduced. However, ceramic substrates with low dielectric constants less than 5.5 and thermal expansion coefficients which closely match that of silicon (3.4 ppm/°C.) are not readily available.

Low temperature co-fired (LTCF) technology has been recently introduced as a method for fabricating multilayer circuits. This technology offers the combination of the processing advantages of high temperature co-fired (HTCF) technology and the materials advantages of thick film technology. These LTCF tape systems have firing temperatures below 1000° C. and allow the use of high conductivity metals such as silver, gold, silver/palladium and copper (copper, however, requires reducing atmospheres). Most of these tape systems have dielectric constants between 6 and 8 and encompass a range of thermal coefficient of expansion (TCE).

Currently, there is no readily available low temperature co-fired dielectric tape system using a glass plus ceramic approach that offers both low dielectric constant (less than 5.5) and a TCE matched to silicon (3.4 ppm/°C.).

Prior Art

A method for producing a multilayer ceramic circuit board for use with copper conductors is described in U.S. Pat. No. 4,642,148, issued to Kurihara et al. Ceramic compositions comprising 10–75 wt. % alpha-alumina, 5–70 wt. % non-crystalline quartz (fused silica), 20–60 wt. % borosilicate glass are disclosed. The dielectric constants of the fired materials ranged from 4.8 to 9.6.

U.S. Pat. No. 4,672,152, issued to Shinohara et al, describes a multilayer ceramic circuit board in which the ceramic is prepared from a mixture of 50–95 wt. % crystallizable glass and 5–50 wt. % ceramic filler. The material has a dielectric constant between 5.1 and 6.0 and a flexural strength above 150 MPa. The crystallizable glass consists of 5–20 wt. % lithium oxide, 60–90 wt. % silicon dioxide, 1–10 wt. % aluminum oxide and 1–5 wt. % alkaline metal oxide other than lithium oxide. The ceramic filler is selected from the group of silicon dioxide, β-eucryptite ($LiAlSiO_4$) and aluminum oxide.

U.S. Pat. No. 3,926,648, issued to Miller, describes a process for sintering powdered crystallizable glasses having compositions approximating the stoichiometry of cordierite ($2MgO.2Al_2O_3.5SiO_2$) into cordierite. The cordierite bodies exhibit low coefficients of thermal expansion and contain hexagonal cordierite as the crystal phase.

U.S. Pat. No. 4,755,490, issued to DiLazzaro, describes a low firing temperature ceramic materials having dielectric constants between 4.5 and 6.1. The materials had coefficient of thermal expansion between 3.9 and 4.2 cm/cm/°C. $\times 10^{-6}$. Example 11 shows k'=4.5 and TCE=3.9. The material is formed from a mixture of 10–50 wt. % alumina, 0–30 wt. % fused silica and 50–60 wt. % (approximately 60–70 vol. %) of a frit composed of about 4 wt. % CaO, about 12 wt. % MgO, about 29 wt. % $B_2O_3$, and about 42 wt. % $SiO_2$. The compositions are fired at a temperature below 1000° C.

U.S. Pat. No. 4,788,046, issued to Barringer et al, describes a glass-ceramic packages for integrated circuits having low sintering temperature. The sintered compositions are formed by coating ceramic particles with glass, separating the coated particles from the glass and then forming the coated particles into a green compact. The material with the lowest dielectric constant (4.5) is obtained using quartz. This material has had a thermal expansion coefficient greater than 5.5.

U.S. Pat. No. 4,849,379, issued to McCormick, describes a composition for making low dielectric layers which is an admixture of finely divided solids. McCormick states that materials such as cordierite and mullite are not suitable for use on $Al_2O_3$ substrates because of TCE mismatch. In addition, McCormick states that compositions containing cordierite and mullite in conjunction with a low softening point glass in general tend to raise TCE, lower firing temperature and increase the dielectric constant of the composition.

U.S. Pat. No. 4,879,261, issued to Burn, describes a low dielectric material having a dielectric less than 5.0. The material is formed from a mixture of finely divided particles consisting essentially of 70-85 wt. % silica and 15-30 wt. % zinc borax flux which is fired to 1065° C. in an oxidizing atmosphere. The composition can be used to make green tape and multilayer devices having internal copper conductors such as multilayer capacitors and multilayer interconnects.

From the foregoing, it can be seen that there is a substantial need for a low temperature co-fireable tape dielectric which (1) has a low dielectric constant (less than 5.5), (2) has a thermal expansion coefficient very close to the value for silicon (3.4 ppm/°C.), and (3) can be fired in air at a low temperature (less than 950° C.), thus permitting the use of high conductivity metallurgies such as gold, silver and silver/palladium.

The principal object of the invention is to provide a material that can be sintered into a body that has a dielectric constant of less than 5.5 at 1 MHz, and a thermal expansion coefficient which closely matches that of silicon.

Another object of the invention is to provide ceramic materials that are sintered at temperatures less than 950° C. for 4-20 hours without significantly increasing their thermal coefficient of expansion.

Another object of the invention is to provide ceramic materials that are sintered at low temperatures to produce dense bodies having low coefficients of thermal expansion and a dielectric constant below 5.5.

SUMMARY OF THE INVENTION

The invention is directed to a ceramic composition for forming a ceramic dielectric body having a dielectric constant of less than about 5.5 at 1 MHz and a low TCE, the composition being co-fireable with high conductivity metals such as gold, silver and silver/palladium. The composition comprises borosilicate glass, and sufficient amounts of a aluminum borate-containing material to inhibit the formation of crystalline forms of silica. In a preferred embodiment of the invention, the aluminum borate is $Al_xB_yO_z$ wherein x is in the range of 4 to 22, y is in the range of 2 to 5, and z is in the range of 9 to 36. In the most preferred embodiment of the invention, the aluminum borate comprises $Al_{18}B_4O_{33}$, $Al_4B_2O_9$ and mixtures thereof.

In a second aspect, the invention is directed to an unfired green tape comprising the composition formed from the above identified mixture dispersed in a polymeric binder that can be fired for periods of time well in excess of four hours without increasing its TCE.

In a further aspect, the invention is directed to a multilayer ceramic substrate comprising layers of the above composition and interconnected conductor layers of copper therebetween, the assemblage having been fired in excess of four hours to form a dense hermetic structure.

In a yet another aspect, the invention is directed to a multilayer ceramic capacitor comprising layers of the above composition with conductor layers of copper therebetween, the assemblage having been fired to form a dense hermetic structure.

DETAILED DESCRIPTION OF THE INVENTION

The preferred glass plus ceramic composition of the present invention comprises a mixture of two major components, i.e., borosilicate glass+sufficient amounts of aluminum borate-containing materials. The percentage of each component may be varied within the ranges delineated below, depending on the final desired properties of the fired ceramic material.

Dense ceramic bodies can be formed from such compositions by normal manufacturing techniques and low temperature (i.e., 850°-1000° C.) sintering. In a preferred application of the invention, such a mixture is formed into a thin tape, via holes punched through the tape at desired locations, and one or more metal conductor paths are formed on the punched tape. Suitable metals for the conductor paths include copper, silver, gold, platinum/gold and palladium/silver. The tape is subsequently sintered at low temperature, typically after two or more sections have been laminated together to form a multilayer circuit substrate.

The borosilicate glass is composed of $B_2O_3$ and $SiO_2$ in amounts such that the mixture has a softening point of about 650°-820° C. A quantity of the mixture is then formed into a desired shape using conventional procedures, and sintered at a temperature of at least 700° C., preferably 850°-950° C. The sintering may be conducted in an oxidizing, neutral or reducing atmosphere.

The term "glass plus ceramic" is used herein to describe a sintered ceramic composition which is formed from a mixture of crystalline ceramics and glass. The ceramic and glass phases of the glass plus ceramic composition remain distinct after firing. The glass in a glass plus ceramic system retains its glassy characteristic after firing and is said to be a non-crystallizable glass in that composition. The ceramic in a glass plus ceramic system need not be a crystalline material; it may also be a glass. The ceramic, whether glassy or crystalline in nature, retains its initial characteristic after firing and is said to behave as a ceramic in that fired composition. In addition, the term "glass plus ceramic" is used herein to distinguish systems containing non-crystallizable glasses from "glass-ceramic" systems in which the glass undergoes a controlled devitrification during firing and becomes crystalline.

The term "borosilicate glass" is used herein to describe a family of glasses containing 10-30 wt. % boron oxide ($B_2O_3$) and 65-85 wt. % silicon oxide ($SiO_2$). Other oxides commonly found in borosilicate glass include $Al_2O_3$, CaO, $K_2O$, $Li_2O$ and $Na_2O$ in amounts such that the mixture has a softening point of about 650°-825° C.

The cristobalite and quartz phases formed during firing remains in the material on cooling. Cristobalite has a TCE of about $50 \times 10^{-6}$/°C. (in the 20°-300° C. range) and quartz has a TCE of about $13 \times 10^{-6}$/°C. as compared to $3.4 \times 10^{-6}$/°C. for silicon. The presence of cristobalite and/or quartz in the fired product raises the TCE and lowers the mechanical strength of the product. The loss of mechanical strength is due to the volume change associated with phase transformation which generates microcracks.

The term "crystalline ceramic material" is used herein to describe a family of refractory ceramic materials containing low levels of elements selected from group IA of the periodic table. The term "crystalline ceramic material" is intended to include, but is not limited to $Al_{18}B_4O_{33}$, $Al_4B_2O_9$. The term "crystalline ceramic material" is not intended to include the various crystalline forms of silica ($SiO_2$) which include quartz, tridymite, flint and cristobalite. As stated above, the presence of crystalline phases of silica, such as quartz and cristobalite, remain in the material during firing and on cooling and its presence in the fired product raises the TCE and lowers the mechanical strength of the product. Linear thermal expansion coefficients for polymorphoric forms of silica are shown in Table 1.

TABLE 1

| Composition | Thermal Coefficient of Expansion | | | |
|---|---|---|---|---|
| | 20–100° C. | 20–200° C. | 20–300° C. | 20–600° C. |
| Quartz | 11.2 | — | 13.2 | 23.7 |
| Cristobalite | 12.5 | — | 50.0 | 27.1 |
| Tridymite | 17.5 | — | 25.0 | 14.4 |

The term "aluminum borate" is used herein to describe material a material consisting essentially of $Al_xB_yO_z$ wherein x is in the range of 4 to 22, y is in the range of 2 to 5, and z is in the range of 9 to 36 and minor amounts of a sintering aid. A preferred aluminum borate material has $Al_{18}B_4O_{33}$ as its major constituent. Aluminum borate may be formed in accordance with the disclosure in U.S Pat. Nos. 4,804,646, 4,774,210 and 4,804,642 which are incorporated herein by reference.

The term "finely divided" is used herein to describe material that is ground to less than about 5 microns in size.

The glasses can be prepared by conventional glass-making techniques by mixing the desired components in the desired proportions and heating the mixture to form melt. As is well known in the art, heating is conducted to a peak temperature and for a time such that the melt becomes entirely liquid and homogeneous.

A preferred borosilicate glass is sold under the tradename "Pyrex Glass Brand No. 7740" and is commercially available from Corning Glass Works. This glass comprises about 0–3 wt. % $Al_2O_3$, 10–20 wt. % $B_2O_3$, 0–1 wt. % CaO, 0–1 wt. % $K_2O$, 0–1 wt. % $Li_2O$, 0–4 wt. % $Na_2O$ and 75–85 wt. % $SiO_2$. Since this glass forms cristobalite during firing, a devitrification inhibitor is needed if any application of this glass is envisioned.

The other preferred borosilicate glass comprises about 0–1 wt. % $Al_2O_3$, 25–30 wt. % $B_2O_3$, 0–1 wt. % CaO, 0.1 wt. % $K_2O$, 0–1 wt. % $Li_2O$, 0–1 wt. % $Na_2O$ and 65–75 wt. % $SiO_2$. A preferred high silica glass (HSG) composition is sold under the tradename Corning 7913 and contains 0.5 wt. % $Al_2O_3$, 3 wt. % $B_2O_3$ and 96.5 wt. % $SiO_2$.

The cristobalite and quartz phases formed during firing remain on cooling. Cristobalite has a TCE of about $50 \times 10^{-6}/°C$. (in the 20°–300° C. range) and quartz has a TCE of about $13 \times 10^{-6}/°C$. as compared to $3.5 \times 10^{-6}/°C$. for silicon. The presence of cristobalite and/or quartz in the fired product raises the TCE and lowers the mechanical strength of the product. The loss of mechanical strength is due to the volume change associated with phase transformation which generates microcracks.

The following examples illustrate preferred ranges of components of the glass plus ceramic compositions of the invention. In Examples 1–2, the borosilicate glass is comprised of 3.0 wt. % $Al_2O_3$, 13.0 wt. % $B_2O_3$, 4.0 wt. % $Na_2O$ and 80 wt. % $SiO_2$; and Examples 3–4, 0.98 wt. % $Al_2O_3$, 26.7 wt. % $B_2O_3$, 0.11 wt. % CaO, 0.84 wt. % $K_2O$, 0.78 wt. % $Li_2O$, 0.2 wt. % $Na_2O$ and 69.8 wt. % $SiO_2$, the high silica glass is Corning 7913 and the aluminum borate has $Al_{18}B_4O_{33}$ as its major constituent.

EXAMPLE 1

In this example, the starting materials consisted essentially of 100 vol. % borosilicate glass (BSG). The borosilicate glass was ground in a 1.3 gallon ball mill for 16 hours to achieve a particle size of 2–4 microns. This inorganic material was combined with 5 wt. % polyethylene glycol binder and 50 wt. % 1-propanol and mixed for 2 hours in a tubular mixer, which is commercially available from Glenn Mills, N.J. The material was then dry pressed into 1.9 cm diameter, 0.3 cm high pellets by compressing the milled mixture in a mold at 13,000 psi ($kg/cm^2$). The pellets were then fired in air. The firing was in two steps. The first step was to burn the binder out. This was accomplished by heating the pellets to 500° C. and holding for 1 hour. Next, the pellets were sintered isothermally at 800° C. for various times ranging from 4 to 12 hours. Thermal expansion coefficient (TCE) was determined in the temperature range from room temperature to 200° C. using a dilatometer. The results of the thermal expansion measurements were recorded in Table 2. TCE is found to increase from 9.9 ppm/C for 4 hours to 16.5 ppm/C for 8–12 hours. Fired materials were analyzed using X-ray diffraction (XRD), and Table 3 reports the relative intensity of cristobalite (100). Note that the original borosilicate glass powder is amorphous to XRD. The amount of cristobalite in the fired materials is found to increase as the firing time increases. It is believed that the precipitation of cristobalite causes the increase in TCE with firing period because the TCE of cristobalite is much greater than that of borosilicate glass (Table 1).

EXAMPLE 2

The procedure of Example 1 was repeated except that the inorganic composition was 60 vol. % BSG and 40 vol. % $Al_{18}B_4O_{33}$ (53.3 wt. % and 46.7 wt. %, respectively) and the firing temperature was 925° C. The results of thermal expansion measurements are shown in Table 2. As noted, the TCE remains relatively unchanged with increasing sintering time. The fired materials were analyzed by using X-ray diffraction, and no cristobalite was detected. Dielectric constant (k') and dissipation factor (DF) were measured by a Hewlett Packard (HP) 4192 AC impedance at 1 MHz, and the results are 5.2 and 0.8%, respectively.

EXAMPLE 3

The procedure of Example 1 was repeated except that the inorganic composition was 40 vol. % BSG and 60 vol. % HSG (39.8 wt. % and 60.2 wt. %, respectively) and the firing temperature was 925° C. The results of thermal expansion measurements are shown in Table 2. As noted, the TCE increases from 8–9 ppm/C for 4 hours to 13–14 ppm/C for 12 hours. The fired materials were analyzed by using X-ray diffraction, and Table 3 reports the observed relative intensity of cristobalite (100) peak. It has been found that the intensity of cristobalite increases with increasing firing time, thus causing an increased TCE with firing time.

EXAMPLE 4

The procedure of Example 1 was repeated except that the inorganic composition was 40 vol. % BSG, 55 vol. % HSG and 5 vol. % $Al_{18}B_4O_{33}$ (39.1 wt. %, 54.3 wt. % and 6.6 wt. %, respectively) and the firing temperature was 925° C. The results of thermal expansion measurements are shown in Table 2. As noted, the TCE remains relatively unchanged with increasing firing time. The fired materials were analyzed by using X-ray diffraction, and no cristobalite was detected. Dielectric constant (k') and dissipation factor (DF) were measured by an Hewlett Packard (HP) 4192 AC impedance at 1 MHz, and the results are 4.05 and 33.%, respectively.

TABLE 2

| Example No. | Sintering Temperature (°C.) | Sintering Time (Hours) | TCE (RT-200C) (ppm/C) |
|---|---|---|---|
| 1 | 800 | 4 | 9.9 |
| 1 | 800 | 8 | 16.5 |
| 1 | 800 | 12 | 16.5 |
| 2 | 925 | 4 | 2.85 |
| 2 | 925 | 8 | 2.89 |
| 2 | 925 | 12 | 2.76 |
| 3 | 925 | 4 | 8–9 |
| 3 | 925 | 8 | 12–13 |
| 3 | 925 | 12 | 13–14 |
| 4 | 925 | 4 | 0.73 |
| 4 | 925 | 8 | 0.76 |
| 4 | 925 | 12 | 0.70 |

TABLE 3

| Example No. | Sintering Temperature (°C.) | Sintering Time (Hours) | Cristobalite (100) (C/S) |
|---|---|---|---|
| 1 | 800 | 4 | 5,511 |
| 1 | 800 | 8 | 19,192 |
| 1 | 800 | 12 | 22,774 |
| 2 | 925 | 4 | 0 |
| 2 | 925 | 8 | 0 |
| 2 | 925 | 12 | 0 |
| 3 | 925 | 4 | 3,671 |
| 3 | 925 | 8 | 5,058 |
| 3 | 925 | 12 | 5,454 |
| 4 | 925 | 4 | 0 |
| 4 | 925 | 8 | 0 |
| 4 | 925 | 12 | 0 |

The products of Examples 1–4 illustrate that the growth of cristobalite precipitate during firing can be significantly reduced by the addition of a small amount of crystalline $Al_{18}B_4O_{33}$. This result is further demonstrated in that the TCE decreases dramatically from the $Al_{18}B_4O_{33}$-free sample, 8–17 ppm/°C., to the sample with 40 vol. % $Al_{18}B_4O_{33}$, 2.7–2.9 ppm/°C. (see Example 2) and with 5 vol. % $Al_{18}B_4O_{33}$, 0.7–0.8 ppm/°C. (see Example 4). Moreover, the TCE of the product of Example 2 is very close to that of silicon (3.4 ppm/°C.), which is very desirable for multilayer ceramic packaging.

In addition, the materials of Examples 2 and 4 have low dielectric constants (4–5.2 at 1 MHz) and low dielectric losses (0.3–0.8% at 1 MHz) which are very desirable to reduce the signal propagation delay in the ceramic substrate.

The materials of Examples 2 and 4 can be used to form multilayer high frequency circuit packages. To form dielectric layers for multilayer high frequency circuit packages, the starting materials are ground in a ball mill until they have an average particle size of 2–4 microns. A slurry is then formed by combining the finely ground powder with a suitable solvent and other conventional additives, such as a plasticizer and a binder, in a manner known in the art. The slurry is cast into thin "green" (unfired) sheets having a thickness of about 75 to 400 microns using a conventional doctor blading process, after which the green sheets are blanked into individual 125 mm square sheets or tapes. Via holes next are formed in the green sheets by a die punching process. The holes suitably may have a diameter of about 125 microns. A conductor paste is applied in a desired pattern to the punched sheets using a screen printing process. The paste is also applied within the via holes to form connections between conductor patterns. The principal metallic constituent of the paste may be gold, silver, copper, silver/palladium alloy, gold/platinum alloy, or other suitable materials. The printed green sheets are then stacked in a desired sequence using alignment holes to insure correct positioning, and laminated together at 50°–100° C. under a pressure between about 35 and 250 kg/cm$^2$. Finally, the laminated green sheets are fired at a temperature not exceeding 1000° C. to form dense, sintered ceramic multilayer circuit substrates. The firing may be done in air if the conductor metal is not susceptible to oxidation at the firing temperature. Such is the case, for example, with the metals named above, except for copper, which requires a reducing or neutral atmosphere. Sheets formed in the manner described will have a lower glass content (25–50 vol. %) and therefore a lower tendency to bow or warp.

The compositions of the present invention also can be used to form rigid, nonporous ceramic bodies by substantially conventional techniques. For example, the batch ingredients of any of the previous examples are combined with water and organic binders, and ball milled for a period of about 20 hours. The resulting slurry is spray dried to provide a powder of substantially spherical particles. This powder can be used to form bodies of various desired shapes by standard forming techniques, such as dry or isostatic pressing. The bodies are then fired at a suitable temperature not exceeding 1000° C. to provide dense, sintered ceramic objects.

Although the invention has been described in terms of using a crystalline $Al_{18}B_4O_{33}$ as a crystal growth inhibitor, other forms of aluminum borate containing low levels of alkali ions may also be used in practicing the present invention. A preferred material contains $Al_{18}B_4O_{33}$, $Al_4B_2O_9$ and mixtures thereof.

Although applicants do not wish to be bound by any theories, it is presently believed that the mechanism of crystallization inhibition is related to the migration of alkali ions in the borosilicate glass to the interface with the crystallization inhibitor. Photomicrographs of a microprobe have revealed that when $Al_{18}B_4O_{33}$ is used as a crystallization inhibitor, sodium and potassium ions in the borosilicate glass migrate toward the $Al_{18}B_4O_{33}$/glass interface during firing of the mixture. At the same time $Al^{+3}$ from $Al_{18}B_4O_{33}$ dissolves into the glass.

It is believed that the segregation of alkali ions in the glass toward a $Al_{18}B_4O_{33}$/glass interface suppresses the tendency of the glass to undergo phase separation at or near the firing temperature of the mixture. This phase separation is believed to be a precursor to crystallization of the glass.

It is further believed that crystalline materials containing alkali ions will reduce the migration of the alkali ions in the borosilicate glass and thus reduce the inhibition of crystal growth that would otherwise be expected. Alkali ions such as sodium are known to increase the dielectric loss of ceramic, which is very undesirable. It is believed that materials that are for all practical purposes alkali-free $Al_{18}B_4O_{33}$, $Al_4B_2O_9$ and combinations thereof may be used as crystal growth inhibitors in practicing the present invention.

In addition, although the invention has been described in terms of using a 1-40 vol. % of a grain growth inhibitor, other amounts may also be used in practicing the present invention. The key is that enough crystalline material be used to cause the desired inhibition of crystal grain growth without introducing other undesirable properties.

It will be apparent to those skilled in the relevant art that various changes and modifications may be made in the embodiments described above to achieve the same or equivalent results without departing from the principles of the present invention as described and claimed herein. All such changes and modifications are intended to be covered by the following claims.

What is claimed is:

1. A ceramic composition having a dielectric constant of less than about 5.5, said composition comprising a mixture of particles of:
   (a) 20-80 vol. % borosilicate glass; and
   (b) 20-80 vol. % of aluminum borate.

2. The ceramic composition of claim 1 in which said aluminum borate is $Al_xB_yO_z$ wherein x is in the range of 4 to 22, y is in the range of 2 to 5, and z is in the range of 9 to 36.

3. The ceramic composition of claim 1 in which said aluminum borate is selected from the group consisting of $Al_{18}B_4O_{33}$, $Al_4B_2O_9$ and mixtures thereof.

4. The ceramic composition of claim 1 in which the borosilicate glass comprises 0-3 wt. % alumina, 10-25 wt. % $B_2O_3$, 0-3 wt. % CaO, 0-3 wt. % $K_2O$, 0-3 wt. % $Li_2O$, 0-4 wt. % $Na_2O$ and 70-85 wt. % $SiO_2$.

5. A ceramic composition for forming a ceramic dielectric body comprising 20-80 vol. % of aluminum borate.

6. The ceramic composition of claim 5 in which said aluminum borate is $Al_xB_yO_z$ wherein x is in the range of 4 to 22, y is in the range of 2 to 5, and z is in the range of 9 to 36.

7. The ceramic composition of claim 5 in which said aluminum borate is selected from the group consisting of $Al_{18}B_4O_{33}$, $Al_4B_2O_9$ and mixtures thereof.

* * * * *